(12) United States Patent
Hurwitz et al.

(10) Patent No.: US 8,963,247 B2
(45) Date of Patent: Feb. 24, 2015

(54) SELECTIVE AMORPHIZATION FOR ELECTRICAL SIGNAL ISOLATION AND LINEARITY IN SOI STRUCTURES

(71) Applicant: Newport Fab, LLC, Newport Beach, CA (US)

(72) Inventors: Paul D. Hurwitz, Irvine, CA (US); Robert L. Zwingman, Walnut, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 13/670,995

(22) Filed: Nov. 7, 2012

(65) Prior Publication Data

US 2013/0181290 A1    Jul. 18, 2013

Related U.S. Application Data

(60) Provisional application No. 61/586,704, filed on Jan. 13, 2012.

(51) Int. Cl.
*H01L 27/12* (2006.01)

(52) U.S. Cl.
USPC ............ 257/347; 257/E33.004; 257/E21.379

(58) Field of Classification Search
USPC .......................... 257/347, E33.004, E21.319
See application file for complete search history.

(56) References Cited

U.S. PATENT DOCUMENTS

| | | | |
|---|---|---|---|
| 6,235,643 B1 | 5/2001 | Mui | |
| 6,432,799 B1 | 8/2002 | Hashimoto | |
| 2005/0148153 A1 | 7/2005 | Takahashi | |
| 2006/0263991 A1 | 11/2006 | Lee | |
| 2007/0235783 A9 | 10/2007 | Sandhu | |
| 2009/0230508 A1 | 9/2009 | Dyer | |
| 2010/0025584 A1 | 2/2010 | Sasaki | |
| 2010/0032796 A1 | 2/2010 | Brown | |
| 2010/0035403 A1* | 2/2010 | Brown et al. | 438/422 |
| 2012/0038024 A1 | 2/2012 | Botula | |
| 2012/0104511 A1 | 5/2012 | Chan | |
| 2012/0313168 A1* | 12/2012 | Cheng et al. | 257/347 |

* cited by examiner

*Primary Examiner* — Tan N Tran
(74) *Attorney, Agent, or Firm* — Farjami & Farjami LLP

(57) ABSTRACT

Provided is a structure for improved electrical signal isolation between adjacent devices situated in a top semiconductor layer of the structure and a method for the structure's fabrication. The structure comprises a gate situated on the top semiconductor layer, the top semiconductor layer situated over a base oxide layer, and the base oxide layer situated over a handle wafer. The top surface of the handle wafer is amorphized by an inert implant of Xenon or Argon to reduce carrier mobility in the handle wafer and improve electrical signal isolation between the adjacent devices situated in the top semiconductor layer.

15 Claims, 4 Drawing Sheets

SELECTIVE AMORPHIZATION FOR ELECTRICAL SIGNAL ISOLATION AND LINEARITY IN SOI STRUCTURES

The present application claims the benefit of and priority to a provisional patent application entitled "Selective Amorphization for Improved Electrical Signal Isolation and Linearity in SOI Structures," Ser. No. 61/586,704 filed on Jan. 13, 2012. The disclosure in that provisional application is hereby incorporated fully by reference into the present application.

BACKGROUND

Silicon on insulator (SOT) applications are commonly utilized where a high degree of noise isolation or low signal loss is required. In conventional SOI applications, a conducting inversion layer is typically present at an interface between a base oxide and a high resistivity handle wafer. Resistivity requirements imposed by active devices used in SOI applications also typically require a top semiconductor layer having a much lower resistivity than the high resistivity handle wafer. The combination of a low resistivity top semiconductor layer and an inversion layer at the base oxide-handle wafer interface results in a lossy, non-linear network that degrades isolation and linearity within SOI applications at high frequencies and power levels.

Attempts to provide a high degree of noise isolation and low signal loss in SOI applications have included forming high resistance portions of the handle wafer in isolation trenches at the interface between the base oxide and handle wafer. However, as the area available for isolation trenches within SOI applications decreases, the effectiveness of such narrow high resistance portions of the handle wafer also decreases.

SUMMARY

The present disclosure is directed to selective amorphization for electrical signal isolation and linearity in SOI structures, substantially as shown in and/or described in connection with at least one of the figures, and as set forth more completely in the claims.

DETAILED DESCRIPTION

Figure 1:
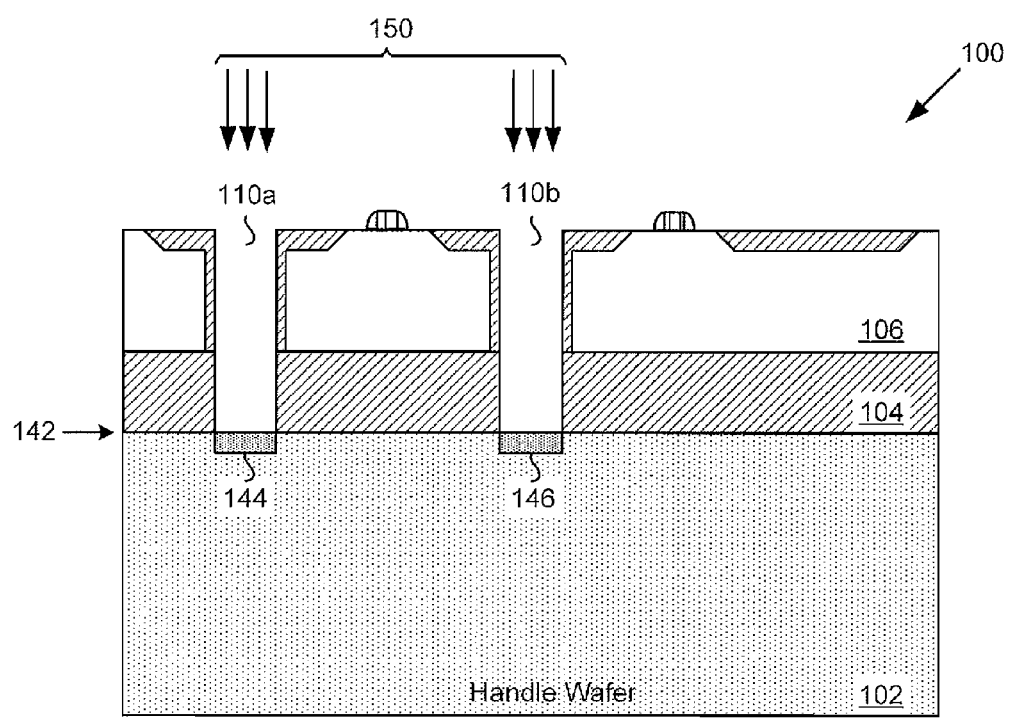
FIG. 1 illustrates an exemplary cross-sectional view of a conventional SOI structure.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates an exemplary cross-sectional view of conventional SOI structure 100 for electrical isolation of an active area including an amorphizing implant in a top surface of handle wafer 102. Conventional SOI structure 100 includes top semiconductor layer 106 disposed over base oxide layer 104, and handle wafer 102 disposed under base oxide layer 104. Trenches 110a and 110b having substantially parallel sidewalls are etched through top semiconductor layer 106 and base oxide layer 104, terminating at interface 142 between base oxide layer 104 and underlying handle wafer 102. An amorphizing implant 150 is then applied to the exposed top surface of handle wafer 102 at the bottom of trenches 110a and 110b forming amorphized regions 144 and 1.46 at the bottom of trenches 110a and 110b, respectively. Amorphized regions 144 and 146 increase the length and impedance of a signal path between adjacent active devices disposed in, or on, top semiconductor layer 106. However, because the increase in the length and impedance of the signal path along amorphized regions 144 and 146 is limited to the width of trenches 110a and 110b, the extent to which electrical signal isolation and linearity may be improved is unacceptably limited. Furthermore, as the area available for isolation trenches within SOI applications decreases, the effectiveness of conventional isolation trenches also decreases. In addition, handle wafer regions directly under any active devices remain unaffected by the amorphizing implant. Thus, many trenches would be required to effectively isolate a large device from surrounding active regions and interconnects.

Figure 2A:
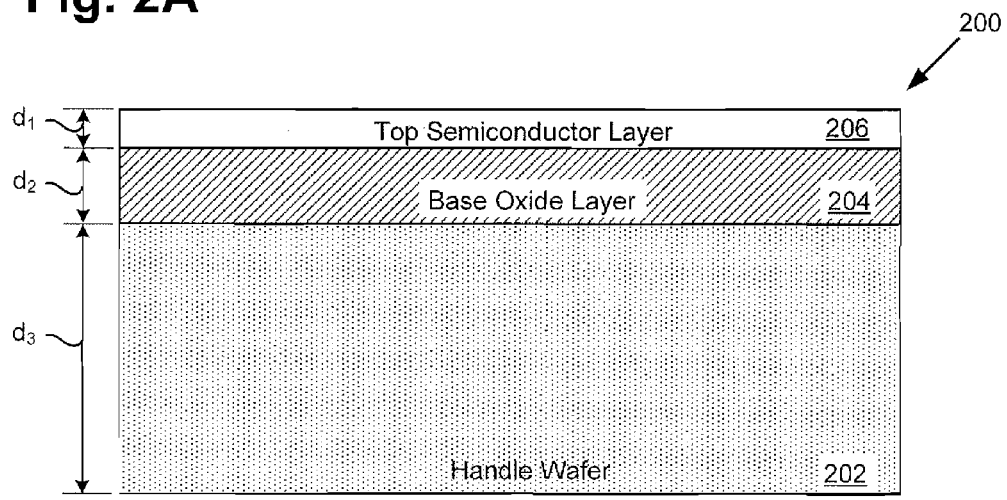
FIG. 2A illustrates an exemplary cross-sectional view of an SOI structure during fabrication, in accordance with one implementation of the present application.
Figure 2B:
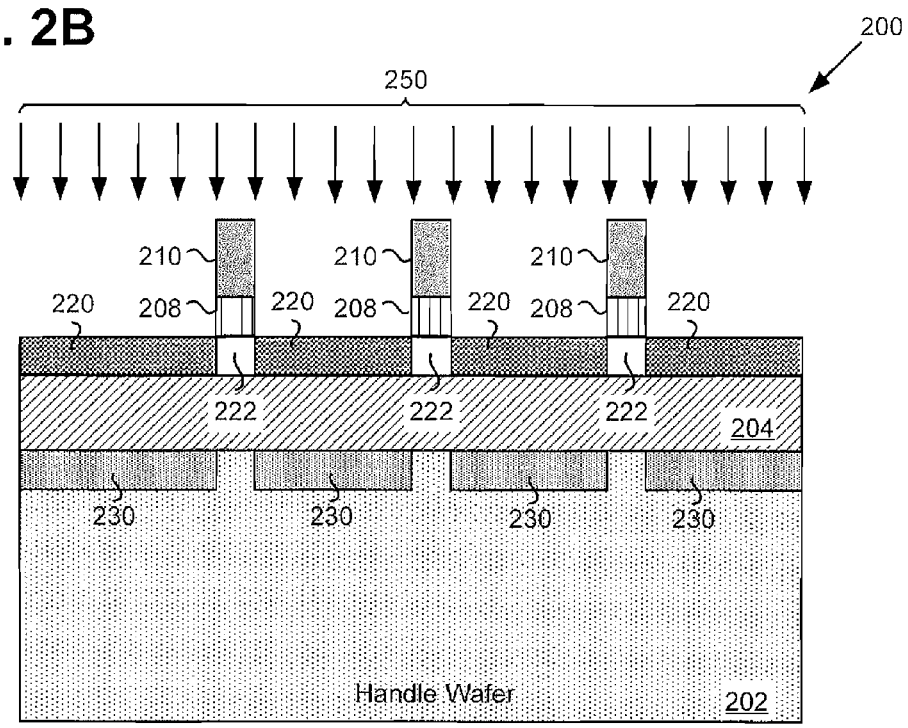
FIG. 2B illustrates an exemplary cross-sectional view of an SOI structure during fabrication, in accordance with one implementation of the present application.
Figure 2C:
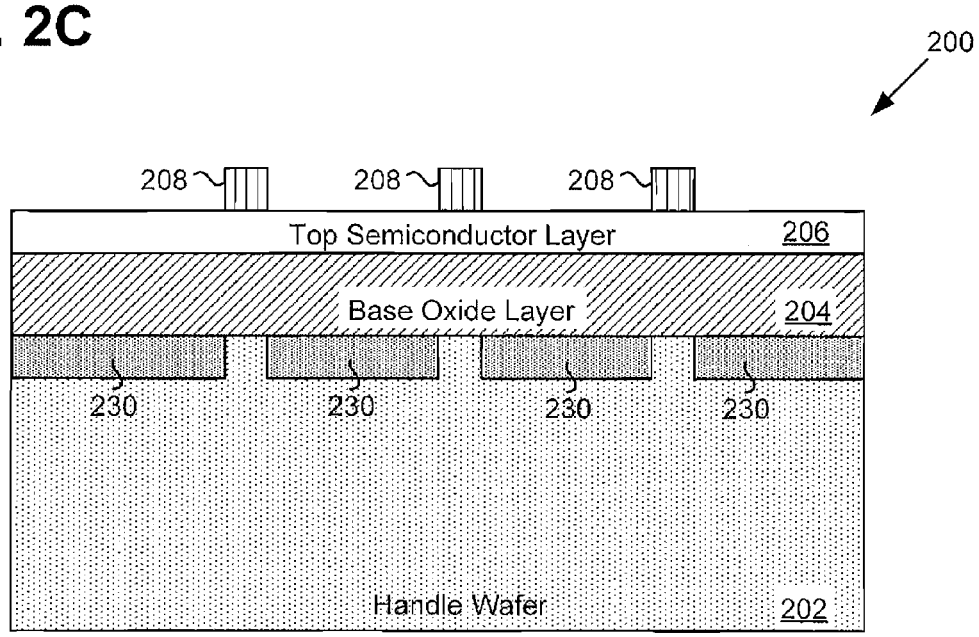
FIG. 2C illustrates an exemplary cross-sectional view of an SOI structure during fabrication, in accordance with one implementation of the present application.
Figure 3:
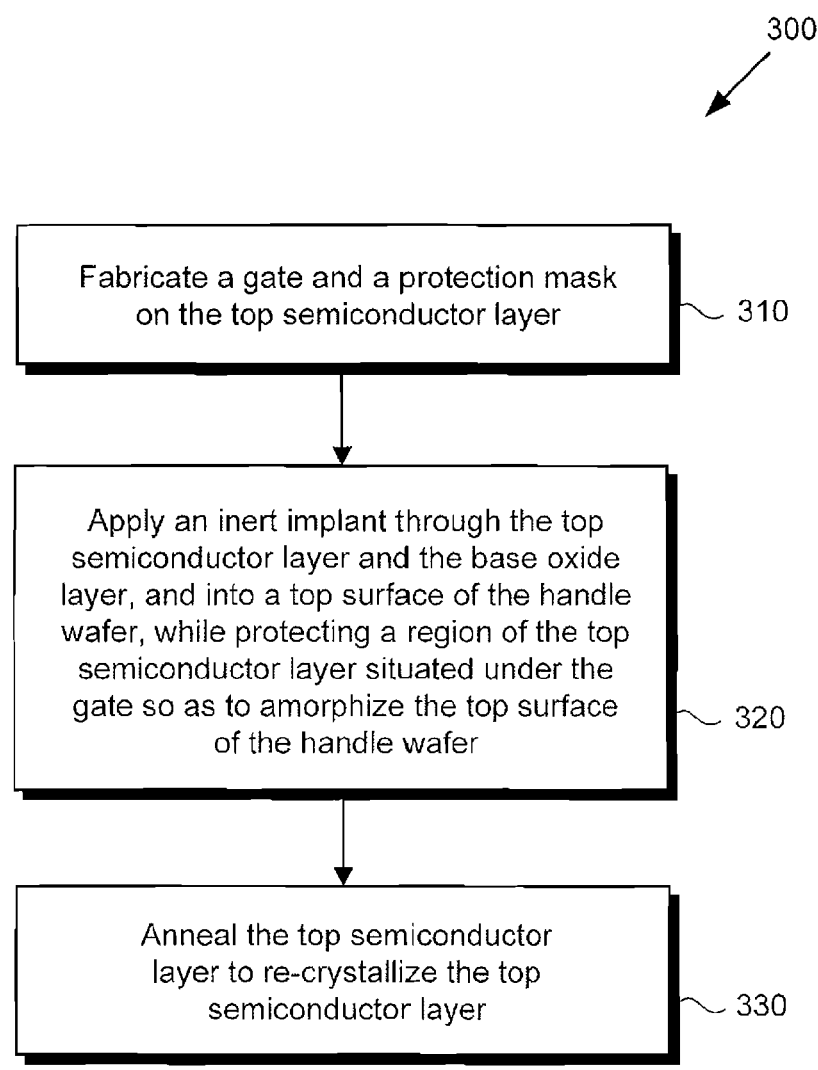
FIG. 3 presents an exemplary flowchart illustrating a method for fabricating an SOI structure, in accordance with one implementation of the present application.

The fabrication of an SOI structure for improving electrical signal isolation and linearity will now be described with reference to FIGS. 2A-2C and FIG. 3. FIGS. 2A-2C illustrate exemplary progressive cross-sectional views of the fabrication of an SOI structure for improving electrical signal isolation and linearity, in accordance with one implementation of the present application. FIG. 3 shows an exemplary flowchart presenting actions taken to implement a method of fabricating an SOI structure for improving electrical signal isolation and linearity in SOI technologies, in accordance with one implementation of the present application. The present inventive concepts are applicable to, among other things, fabrication of large active devices, such as high powered FETs for example, where mechanical stability and reliability limit the use of air-gaps under the base oxide, or limit the area available for dedicated isolation trenches.

Referring now to FIG. 2A, FIG. 2A shows a thin film SOI starting wafer commonly used in the fabrication of CMOS technology. Specifically, SOI structure 200 may include top semiconductor layer 206 disposed over base oxide layer 204 and base oxide layer 204 disposed over handle wafer 202. Top semiconductor layer 206 may be sufficiently thin that a bottom of a source and/or drain region disposed in top semiconductor layer 206 may be in direct contact with underlying base oxide layer 204. Thus, top semiconductor layer 206 may have thickness $d_1$ of 0.3 µm, for example. Base oxide layer 204 may have thicknesses $d_2$ of 1 µm, for example. And handle wafer 202 may have thickness $d_3$ of up to 725 µm, for example. However, these thicknesses may be greater than or less than the above thicknesses depending on the specific requirements of a particular application.

Referring now to action 310 of flowchart 300, action 310 includes fabricating a gate and a protection mask on the top semiconductor layer. FIG. 2B, for example, illustrates such an action applied to an SOI structure 200 where one or more gates 208 are fabricated on top semiconductor layer 206 using protection mask 210. Protection mask 210 may be formed from a photoresist material or, in the alternative, from any appropriate hardmask material commonly used in the art.

Continuing with action 320 of flowchart 300, action 320 includes applying an inert implant through the top semiconductor layer and the base oxide layer, and into a top surface of the handle wafer, while protecting a region of the top semiconductor layer situated under the gate so as to amorphize the top surface of the handle wafer. FIG. 2B, for example, illustrates such an action applied to SOI structure 200 where an entire active region receives high energy inert implant 250 to amorphize the top surface of handle wafer 202. High energy inert implant 250 forms amorphized regions 230 in the top surface of handle wafer 202. High energy inert implant 250 may be applied directly through top semiconductor layer 206 and base oxide layer 204, using protection mask 210 and gate 208 to shield protected region 222 of top semiconductor layer 206 from damage. Protected region 222 may provide an undamaged channel region for an active device, for example. In the alternative, high energy inert implant 250 may be applied as an unpatterned "blanket" implant where no photoresist is applied to SOI structure 200, or applied utilizing a body doping mask in the base CMOS process flow.

It is desirable that base oxide layer 204 be as thick as possible to maximize isolation between any active devices disposed in, or on, top semiconductor layer 206. Thus, high implant energies are required to ensure high energy inert implant 250 reaches the top surface of handle wafer 202, being applied through both top semiconductor layer 206 and base oxide layer 204. Inert elements such as Xenon or Argon, for example, may be used for high energy inert implant 250. For example, implant energies of at least 50 KeV for Xenon or at least 400 KeV for Argon may be used to ensure proper implantation depth. However, these implant energies may be greater than or less than the above energies to suit the specific needs of a particular application.

Using such high implant energies may cause significant damage to unprotected portions of top semiconductor layer 206 as the inert elements are driven through the layer. Such damaged regions are shown as damaged regions 220 in FIG. 2B. The regions under gates 208 may be screened from high energy inert implant 250 to preserve the crystalline structure of top semiconductor layer 206 in protected regions 222. Protected regions 222 may serve as seed crystals for self-aligned re-crystallization of damaged regions 220 within top semiconductor layer 206 during a subsequent thermal anneal. For efficient use of the lithography action embodied by action 310, a custom extension implant may now be performed. Specifically for RF switches, the custom extension implant may be optimized for low on resistance in the RF branches of the RF switches. Protection mask 210 may then be removed.

Continuing with action 330 of flowchart 300, action 330 includes annealing the top semiconductor layer to re-crystallize the top semiconductor layer. FIG. 2C, for example, illustrates such an action applied to SOI structure 200 where a high temperature anneal is used to epitaxially re-crystallize damaged regions 220 of top semiconductor layer 206 using protected regions 222 as seed crystals. In one specific implementation, SOI structure 200 may be annealed at a temperature of 950° to 1050° C. for 10 to 15 seconds. However, the anneal temperature and duration may be greater than or less than the above values to suit the specific needs of a particular application, so long as the anneal results in self-aligned re-crystallization of damaged regions 220, while leaving amorphized regions 230 of handle wafer 202 unaltered.

Amorphized regions 230 formed by high energy inert implant 250 may contain a high density of carrier traps that significantly reduce the mobility of carriers in amorphized regions 230, as compared to adjacent undamaged portions of handle wafer 202 disposed under gates 208. The carrier traps pin the carrier density in amorphized regions 230, making amorphized regions 230 insensitive to any voltage potential present in top semiconductor layer 206. Thus, amorphized regions 230 provide superior isolation and linearity between adjacent active devices situated in top semiconductor layer 206.

Thus, an SOI structure for improving electrical signal isolation and linearity, according to an implementation of the present application, provides enhanced substrate isolation under substantially an entire active device, rather than only in isolation trenches around the active device periphery. Specifically, because high energy inert implant 250 may be driven into substantially the entire top surface of handle wafer 202, path lengths through amorphized regions 230 may span substantially the entire dimension of the top surface of handle wafer 202. Thus, implementations of the present application are not limited to the width of isolation trenches, as are conventional SOT structures discussed above. Amorphized regions 230 result in a substantially increased impedance between adjacent devices in top semiconductor layer 206, for example. Consequently, any inversion layer located at the interface between base oxide 204 and the underlying handle wafer 202 will be of higher resistivity at amorphized regions 230 of handle wafer 202. Thus, substrate related losses are reduced and linearity of the isolated devices is enhanced.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A structure for improved electrical signal isolation between adjacent devices situated in a top semiconductor layer of said structure, said structure comprising:
 a gate situated on said top semiconductor layer, said top semiconductor layer situated over a base oxide layer, and said base oxide layer situated over a handle wafer;
 wherein a top surface of said handle wafer is amorphized to form an amorphized region substantially aligned with said gate, thereby reducing carrier mobility in said handle wafer to improve electrical signal isolation between said adjacent devices situated in said top semiconductor layer.

2. The structure of claim 1, wherein said top surface of said handle wafer contains an inert implant of Argon.

3. The structure of claim 1, wherein said top surface of said handle wafer contains an inert implant of Xenon.

4. The structure of claim 1, further comprising a plurality of carrier traps disposed in said top surface of said handle wafer due to said top surface of said handle wafer being amorphized.

5. The structure of claim 1, further comprising a channel region, said channel region comprising a portion of said top semiconductor layer masked by said gate.

6. A structure for improved electrical signal isolation between adjacent devices situated in a top semiconductor layer of said structure, said structure comprising:
- a gate situated on said top semiconductor layer, said top semiconductor layer situated on a base oxide layer, and said base oxide layer situated on a handle wafer;
- an amorphized region comprising a top surface of said handle wafer not masked by said gate, said amorphized region substantially aligned with said gate;
- wherein said amorphized region has a substantially reduced carrier mobility compared to an adjacent portion of said handle wafer, thereby improving electrical signal isolation between said adjacent devices situated in said top semiconductor layer.

7. The structure of claim 6, further comprising a channel region, said channel region comprising a portion of said top semiconductor layer masked by said gate.

8. The structure of claim 6, wherein an inert implant, selected from the group consisting of Xenon and Argon, is disposed in said amorphized region.

9. The structure of claim 8, wherein said inert implant forms a plurality of carrier traps in said amorphized region.

10. The structure of claim 6, wherein said structure is a thin film SOI structure.

11. A structure comprising:
- a gate situated over a top semiconductor layer, said top semiconductor layer situated over a handle wafer;
- a top surface of said handle wafer being amorphized to form an amorphized region substantially aligned with said gate, thereby reducing carrier mobility in said handle wafer to improve electrical signal isolation between adjacent devices situated in said structure.

12. The structure of claim 11, wherein said top surface of said handle wafer contains an inert implant of Argon.

13. The structure of claim 11, wherein said top surface of said handle wafer contains an inert implant of Xenon.

14. The structure of claim 11, further comprising a plurality of carrier traps disposed in said top surface of said handle wafer due to said top surface of said handle wafer being amorphized.

15. The structure of claim 11, further comprising a channel region, said channel region comprising a portion of said top semiconductor layer masked by said gate.

* * * * *